(12) United States Patent
Ferrari et al.

(10) Patent No.: US 11,013,133 B2
(45) Date of Patent: May 18, 2021

(54) ELECTRONIC DEVICES COMPRISING BUTYL RUBBER

(71) Applicants: ARLANXEO SINGAPORE PTE. LTD., Singapore (SG); The University of Windsor, Windsor (CA)

(72) Inventors: Lorenzo Ferrari, Burlington (CA); Gregory J. E. Davidson, London (CA); Tricia Breen Carmichael, Windsor (CA)

(73) Assignees: ARLANXEO SINGAPORE PTE. LTD, Singapore (SG); The University of Windsor, Windsor (CA)

( * ) Notice: Subject to any disclaimer, the term of this patent is extended or adjusted under 35 U.S.C. 154(b) by 0 days.

(21) Appl. No.: 16/739,772

(22) Filed: Jan. 10, 2020

(65) Prior Publication Data
US 2020/0154587 A1 May 14, 2020

Related U.S. Application Data

(63) Continuation of application No. 14/651,507, filed as application No. PCT/CA2013/001043 on Dec. 17, 2013, now abandoned.
(Continued)

(51) Int. Cl.
*B32B 7/06* (2019.01)
*H05K 5/06* (2006.01)
(Continued)

(52) U.S. Cl.
CPC ............... *H05K 5/065* (2013.01); *B32B 7/06* (2013.01); *B32B 17/06* (2013.01);
(Continued)

(58) Field of Classification Search
CPC ..... B32B 17/06; B32B 17/1055; B32B 25/18; B32B 7/06; B32B 2250/02;
(Continued)

(56) References Cited

U.S. PATENT DOCUMENTS 5,825,489 A * 10/1998 Lagakos ............... G01H 9/004
356/477
6,069,185 A 5/2000 Bahadur et al.
(Continued)

FOREIGN PATENT DOCUMENTS

| CA | 2621788 A1 | 8/2008 |
| CN | 101151343 A | 3/2008 |

(Continued)

OTHER PUBLICATIONS

Decision to Grant Patent, Japanese Patent Application No. 2015-549119 drafting date May 17, 2018.
(Continued)

*Primary Examiner* — Travis M Figg
(74) *Attorney, Agent, or Firm* — The Dobrusin Law Firm, P.C.

(57) ABSTRACT

This invention relates to elastomeric coatings for electronics. Disclosed is a electronic device comprising a substrate layer, a conductive layer and an encapsulant layer. The encapsulant layer comprises at least a butyl rubber material. The butyl rubber encapsulant prevents a change in resistivity of the conductive layer following exposure to nitric acid vapour for 12 hours or hydrochloric acid vapour for 10 hours.

20 Claims, 6 Drawing Sheets

Related U.S. Application Data (60) Provisional application No. 61/738,707, filed on Dec. 18, 2012.

(51) Int. Cl.
*B32B 25/18* (2006.01)
*B32B 17/10* (2006.01)
*B32B 17/06* (2006.01)
*H01L 23/29* (2006.01)

(52) U.S. Cl.
CPC .......... *B32B 17/1055* (2013.01); *B32B 25/18* (2013.01); *H01L 23/293* (2013.01); *H01L 23/295* (2013.01); *B32B 2250/02* (2013.01); *B32B 2255/205* (2013.01); *B32B 2307/7242* (2013.01); *B32B 2457/00* (2013.01); *H01L 2924/0002* (2013.01); *Y10T 428/239* (2015.01)

(58) Field of Classification Search
CPC ...... B32B 2255/205; B32B 2307/7242; B32B 2457/00; H01L 23/293; H01L 23/295; H01L 2924/0002; H01L 2924/00; H05K 5/065; Y10T 428/239
See application file for complete search history.

(56) References Cited

U.S. PATENT DOCUMENTS

| | | | |
|---|---|---|---|
| 7,696,621 B2 | 4/2010 | Arms et al. | |
| 8,696,836 B2 | 4/2014 | Takahata et al. | |
| 8,969,717 B2 * | 3/2015 | Sager | H02S 10/10 136/259 |
| 2004/0091385 A1 | 5/2004 | Leyendecker et al. | |
| 2007/0218296 A1 * | 9/2007 | Resendes | C08F 8/40 428/441 |
| 2008/0081872 A1 | 4/2008 | Osman et al. | |
| 2008/0207815 A1 | 8/2008 | Resendes et al. | |
| 2010/0180943 A1 * | 7/2010 | Smith | C08K 5/0091 136/256 |
| 2011/0105637 A1 * | 5/2011 | Fujita | C09J 123/22 522/120 |
| 2012/0141787 A1 * | 6/2012 | Lee | C08F 10/10 428/355 EN |

FOREIGN PATENT DOCUMENTS

| | | |
|---|---|---|
| JP | H06172547 A | 6/1994 |
| JP | 08037039 A | 2/1996 |
| JP | 2006012931 A | 1/2006 |
| WO | 2010/047169 A1 | 4/2010 |
| WO | 2012/019301 A2 | 2/2012 |
| WO | 2012/040637 A2 | 3/2012 |
| WO | 2012/083419 A1 | 6/2012 |
| WO | WO-2012083419 A1 * | 6/2012 ................ C08J 3/24 |

OTHER PUBLICATIONS

Chinese Third Office Action for CN 2013800733148 dated Aug. 13, 2018 with English Translation.
Morton, Maurice (editor), "Butyl and Halobutyl Rubbers," Rubber Technology, 1987, Van Nostrand Reinhold Company Inc., pp. 297-300.
Othmer, Kirk, Composites, Fabrication to Die Design, "Compounding", vol. 4, Encyclopedia of Polymer Science and Engineering. 1986, John Wiley & Sons, Inc., pp. 66-79.
International Search Report from International Application No. PCT/CA2013/001043, dated Mar. 5, 2014, two pages.

* cited by examiner

ELECTRONIC DEVICES COMPRISING BUTYL RUBBER

FIELD OF THE INVENTION

The present invention relates to electronic devices comprising butyl rubber. More particularly, the invention relates to electronic devices that are encapsulated with butyl rubber.

BACKGROUND

Electrical or electronic devices comprise a backplate or other mounting component on to which the electrical or electronic components are mounted. To protect the electrical or electronic devices from corrosion, flexible encapsulants, such as poly(dimethylsiloxane) (PDMS) are sometimes used. However, due to the high permeation rate of this material, moisture and gas are still able to eventually penetrate the PDMS encapsulant, leading to premature device failure. In order to improve device lifetime, improved encapsulants are needed.

SUMMARY OF THE INVENTION

According to an aspect of the present invention, there is provided an electrical device comprising a substrate layer, a conductive layer and an encapsulant layer, wherein the encapsulant layer comprises butyl rubber. The device may be an electronic device. The butyl rubber may be optically transparent. The butyl rubber may be peroxide cured. The butyl rubber may be in the form of a butyl rubber ionomer. The butyl rubber ionomer may be made from reaction of a halogenated butyl rubber and a nitrogen or phosphorous based nucleophile. The nitrogen or phosphorous based nucleophile may comprise a pendant vinyl group. The nucleophile may comprise diphenylphosphinostyrene (DPPS).

In some embodiments, the device may prevent a change in electrical resistance following exposure to nitric acid vapour for 12 hours or hydrochloric acid vapour for 10 hours.

In other embodiments, the device may exhibit an increase in electrical resistance of less than 360%, less than 300%, less than 200%, less than 100%, less than 50%, less than 25%, less than 10%, less than 5% or less than 3% following exposure to nitric acid vapour.

Further aspects of the invention will be apparent to those of skilled in the art with reference to the following description.

BRIEF DESCRIPTION OF THE DRAWINGS

In order that the invention may be more clearly understood, preferred embodiments thereof will now be described with reference to the accompanying figures, in which.

DETAILED DESCRIPTION

As defined in this disclosure, an electrical device, such as an electronic device, comprises a substrate layer, a conductive layer mounted on at least one side of the substrate layer, and an encapsulant layer mounted over the conductive layer or layers. The substrate layer may be composed of any suitable electrical or electronics substrate that exhibits sufficient electrical resistance (non-conductivity) to prevent short-circuiting of the conductive layer. Suitable flexible substrates may comprise glass to impart mechanical strength as well as electrical resistivity.

The conductive layer may comprise electrically conductive materials arranged in traces or wire patterns on the substrate. These traces or wire patterns may be used to connect one or more electrical loads, such as electronic components. The electronic components may be arranged in a suitable configuration to produce a desired electronic result. Examples of suitable materials for use in the conductive layer may comprise silver, gold, platinum, copper, or other conductive metallic components, or may comprise metallic alloys, such as indium tin oxide, gold alloys, copper alloys, or the like.

The encapsulant layer is provided atop the conductive layer opposite the substrate layer in order to impart environmental resistance to the conductive layer, thereby improving device lifetime. Imparting environmental resistance may comprise reducing exposure to moisture, atmospheric gases, environmental chemicals, or similar environmental factors that would reduce device lifetime.

The encapsulant layer is resilient to deformation; however, the encapsulant layer also has sufficient physical strength, such as ultimate tensile strength, modulus of elongation, and various other rheological properties, to function effectively as a robust protector for the conductive layer.

The encapsulant layer may be applied directly to the conductive layer, or may be applied over the conductive layer and adhered to a border or fringe of the substrate layer along a perimeter of the conductive layer. This approach may be advantageous in situations where it is desirable to remove the encapsulant layer for repair of the conductive layer, without inadvertently damaging components located on the conductive layer.

Butyl rubber polymers are generally derived from at least one isoolefin monomer, at least one multiolefin monomer and optionally further copolymerizable monomers. The butyl rubber may comprise repeating units derived from an isoolefin monomer and a conjugated diene monomer. In another embodiment, the butyl ionomer may comprise repeating units derived from an isoolefin monomer, a conjugated diene monomer and a styrenic monomer.

The butyl rubber polymer is not limited to a specific isoolefin. Any isoolefin, as known to those of skill in the art, are contemplated by the present invention including isoolefins having, for examples, within the range of from 4 to 16 carbon atoms. In one embodiment of the present invention, isoolefins having from 4-7 carbon atoms are contemplated. Examples of isoolefins for use in the present invention include isobutene, 2-methyl-1-butene, 3-methyl-1-butene, 2-methyl-2-butene, 4-methyl-1-pentene and mixtures. A preferred isoolefin is isobutene (isobutylene).

Similarly, the butyl rubber polymer is not limited to a specific multiolefin. Multiolefins copolymerizable with the isoolefins, as known to one skilled in the art, can be used in the practice of the present invention. Conjugated diene multiolefin monomers are preferred. Examples of such multiolefins include, for example, those having in the range of from 4-14 carbon atoms. Examples of suitable multiolefins include isoprene, butadiene, 2-methylbutadiene, 2,4-dimethylbutadiene, piperyline, 3-methyl-1,3-pentadiene, 2,4-hexadiene, 2-neopentylbutadiene, 2-methyl-1,5-hexadiene, 2,5-dimethyl-2,4-hexadiene, 2-methyl-1,4-pentadiene, 2-methyl-1,6-heptadiene, cyclopentadiene, methylcyclopentadiene, cyclohexadiene, 1-vinyl-cyclohexadiene and mixtures thereof. A preferred multiolefin comprises isoprene.

The butyl rubber may include a co-monomer other than the above referenced multiolefins, such as an alkyl-substituted vinyl aromatic co-monomer, including but not limited to a $C_1$-$C_4$ alkyl substituted styrene. Specific examples of such co-monomers include, for example, a-methyl styrene, p-methyl styrene, chlorostyrene, cyclopentadiene and methylcyclopentadiene. In this embodiment, the butyl rubber polymer may include, for example, random copolymers of isobutylene, isoprene and para-methylstryene.

Once the butyl rubber polymer is formed from the monomer mixture, the butyl rubber polymer may be subjected to a halogenation process in order to form the halogenated butyl rubber polymer or halobutyl rubber polymer. Bromination or chlorination can be performed according to the process known by those skilled in the art, for example, the procedures described in Rubber Technology, 3rd Ed., Edited by Maurice Morton, Kluwer Academic Publishers, pp. 297-300 and further documents cited therein.

In one embodiment, a halogenated butyl rubber for use in the present invention includes a halogenated butyl rubber having isobutylene and less than 2.2 mol % isoprene, which is commercially available from LANXESS Deutschland GmbH and sold under the name BB2030™.

During halogenation, some or all of the multiolefin content of the butyl polymer is converted to allylic halides. The allylic halides in the halobutyl polymer are therefore repeating units derived from the multiolefin monomers originally present in the butyl polymer. The total allylic halide content of the halobutyl polymer cannot exceed the starting multi-olefin content of the parent butyl polymer.

The allylic halide sites of the halobutyl polymer can then be reacted with at least one nitrogen or phosphorus containing nucleophile according to the following formula, wherein:
A is nitrogen or phosphorus; and,
$R_1$, $R_2$ and $R_3$ are independently selected and comprise: linear or branched $C_1$-$C_{18}$ alkyl substituents; an aryl substituent which is monocyclic or composed of fused $C_4$-$C_8$ rings; or, combinations thereof, wherein at least one of $R_1$, $R_2$ or $R_3$ contains a pendant vinyl group.

In general, the appropriate nucleophile will contain at least one neutral phosphorus or nitrogen center which possesses a lone pair of electrons which is both electronically and sterically accessible for participation in nucleophilic substitution reactions. Suitable nucleophiles include but are not limited to diphenylphosphinostyrene (DPPS), allyldiphenylphosphine, diallylphenylphosphine, diphenylvinylphosphine, triallylphenylphosphine, N-vinyl caprolactam, N-vinyl phthalimide, 9-vinyl carbazole, N-[3-(dimethylamino)propyl]methacrylamide, diphenylvinylphsophin-methyl-N-vinylacetamide, N-allyl-N-butyl-2-propen-1-amine, 1-vinyl-2-pyrrolidone, 2-isopropenyl-2-oxazoline, 2-vinylpyrid-4-vinylpyridine, N-ethyl-2-vinylcarbazole or mixtures thereof.

A nucleophile that is particularly suitable for use with the present invention comprises diphenylphosphinostyrene (DPPS), shown below.

Figure 1:
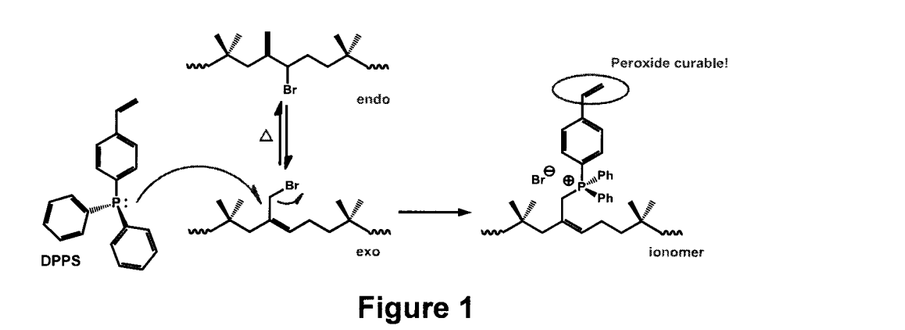
FIG. 1 is a reaction mechanism for the formation of BB2030-DPPS butyl rubber ionomer.

When reacted with halogenated butyl rubber containing allylic halides produced at the multiolefin sites of the starting polymer, the reaction product produces a butyl rubber ionomer having unsaturation at the pendant vinyl sites. This unsaturation is in addition to any residual unsaturation remaining in the halogenated butyl rubber starting material. Unsaturation allows peroxide curability of the ionomer, without the molecular weight degradation and chain scission that normally occurs when insufficient olefinic bonds are present. The reaction process is pictured in FIG. 1.

The amount of nucleophile reacted with the butyl rubber may be in the range of from 0.05 to 5 molar equivalents, more preferably 0.5 to 4 molar equivalents and even more preferably 1 to 3 molar equivalents based on the total molar amount of allylic halide present in the halobutyl polymer.

The halobutyl polymer and the nucleophile can be reacted for about 0.25 to 90 minutes. When the reaction takes place in an internal mixer the reaction is preferably between 1 to 90 minutes, more preferably from 1 to 60 minutes.

Since the nucleophile reacts with the allylic halide functionality of the halobutyl polymer, the resulting ionomeric moiety is a repeating unit derived from an allylic halide. The total content of ionomeric moiety in the butyl ionomer therefore cannot exceed the starting amount of allylic halide in the halobutyl polymer; however, residual allylic halides and/or residual multiolefins may be present. The resulting halobutyl based ionomer preferably possesses at least 0.05 mol %, preferably at least 0.75 mol %, more preferably at least 1.0 mol % of the ionomeric moiety up to an amount not exceeding the original allylic halide content of the halobutyl polymer used to produce the butyl ionomer. Residual allylic halides may be present in a non-zero amount up to an amount not exceeding the original allylic halide content of the halobutyl polymer used to produce the butyl ionomer. Residual multiolefin may be present in a non-zero amount up to an amount not exceeding the original multiolefin content of the butyl polymer used to produce the halobutyl polymer.

Figure 2:
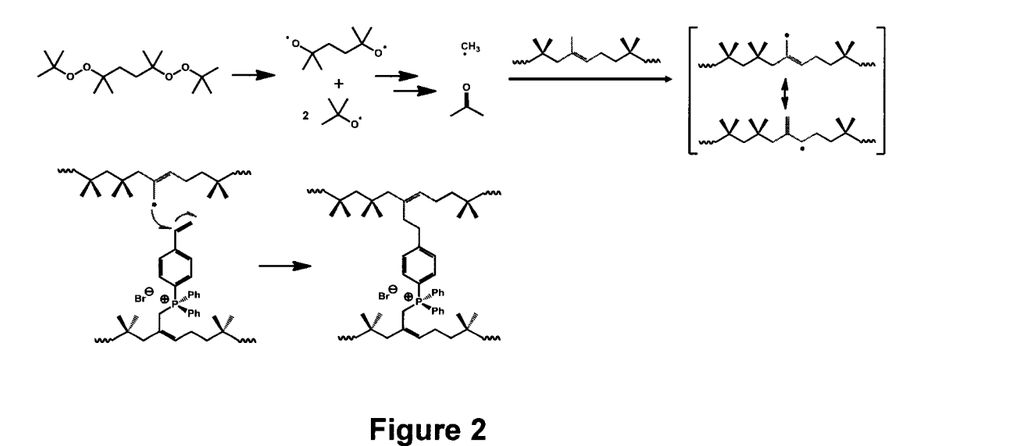
FIG. 2 is a reaction mechanism for peroxide cure of BB2030-DPPS butyl rubber ionomer.

The presence of the pendant vinyl group makes the butyl rubber suitable for peroxide curing, despite the lack of high levels of residual multiolefin content in the polymer backbone previously thought necessary to allow peroxide curing without undue chain scission and molecular weight degradation. A schematic of the peroxide curing of butyl rubber ionomer compounds comprising pendant vinyl groups is provided in FIG. 2.

The state of peroxide cure is enhanced with butyl polymers containing increased levels of unsaturation. This can be achieved with polymers having elevated levels of multiolefin content in the polymer backbone or, in the case of ionomers, through addition of increased unsaturation attributable to the pendant vinyl groups of the phosphorous or nitrogen based nucleophile. It is desirable that the total combined amount of unsaturation in the butyl rubber ionomer, comprising both residual unsaturation in the polymer backbone and unsaturation in the pendant vinyl groups, is at least 0.5 mol %, preferably greater than 1.0 mol %, as this leads to desirably enhanced cure states for butyl rubber ionomers. Non-ionomeric butyl rubber polymers with elevated levels of isoprene in the polymer backbone, for example in excess of 3.5 mol %, can also be used to achieve enhanced cure states. Desirable peroxide cured butyl rubber compounds comprise a cure state MH greater than 4.5 dNm, greater than 7.5 dNm, greater than 10 dNm greater than 12 dNm, or greater than 12.5 dNm.

In some embodiments, no fillers are employed in the compounds used as encapsulants for the electrical devices. These filler free compounds are formulated to possess the desired physical properties when cured, without the benefit of filler re-enforcement. However, in other embodiments, it is possible to employ certain fillers to enhance the physical properties of the final cured compounds. Examples of suitable fillers that may be used include Aerosil® fumed silica and similar products available under alternative tradenames. Other examples include clays, such as calcined clays, and polyethylene.

Rubber compounds created for use in electrical devices desirably exhibit enhanced physical strength in the unfilled state. In one embodiment, compounds have a modulus at 200% elongation of greater than 0.52 MPa, greater than 1.3 MPa, greater than 2 MPa, or greater than or equal to 2.9 MPa.

It is desirable that the encapsulant exhibits impermeability to gases, such as an impermeability to oxygen in the range of from 170-325 cc-mm/$(m^2$-day), from 170-240 cc-mm/$(m^2$-day), from 200-240 cc-mm/$(m^2$-day), or from 212-220 cc-mm/$(m^2$-day).

As evidence of its impermeability, it is desirable that the substrate prevents corrosion of the conductive layer. The extent of corrosion may be determined by measuring the change in electrical resistance of the conductive layer. The butyl rubber encapsulant desirably minimizes changes in electrical resistance of the conductive layer following exposure of the device to nitric acid vapour for 12 hours or hydrochloric acid vapour for 10 hours. In another embodiment, this change in electrical resistance may be less than 300%, less than 200%, less than 100%, less than 50%, less than 25%, or less than 10%, less than 5% or less than 3%.

It is also desirable that the cured compounds exhibit low surface tackiness in order to enable them to be handled, processed and ultimately used in a variety of applications. Such compounds can be said to be non-tacky, at least relative to conventional uncured butyl rubber compounds.

A combination of some or all of the foregoing physical, Theological, permeability, transparency and tackiness properties is desirable to form a cured article useful in a variety of applications.

In some embodiments, stabilizers, anti-oxidants, tackifiers, and/or other additives as known to those of skill in the art may also be added. However, it is important that these additives are chosen and/or added in an amount consistent with preserving the desired physical and electrical properties of the material.

In embodiments where the butyl rubber composition used for the encapsulant comprises a nucleophile, curing agents, and/or other additives, the ingredients may be compounded together using conventional compounding techniques. Suitable compounding techniques include, for example, mixing the ingredients of the composite together using, for example, an internal mixer, such as a Banbury mixer, a miniature internal mixer, such as a Haake or Brabender mixer, or a two roll mill mixer. An extruder also provides good mixing, and permits shorter mixing times. It is possible to carry out the mixing in two or more stages, and the mixing can be done in different apparatus, for example one stage in an internal mixer and one stage in an extruder. For further information on compounding techniques, see Encyclopedia of Polymer Science and Engineering, Vol. 4, p. 66 et seq. (Compounding). Other techniques, as known to those of skill in the art, are further suitable for compounding. Additionally, fillers, curing agents, and/or other additives may be added to the ionomer. Peroxide cured articles may be made from the compounds of the present invention shaped in the form of coatings or encapsulants for electrical devices. The encapsulants may be molded with or pre-molded and applied to the substrate or conductive layer. An adhesive may be used to apply the encapsulant.

EXAMPLES

Materials

Bromobutyl 2030 (a halogenated butyl rubber polymer having 0.8-1.5 mol % isoprene) is a product of LANXESS Inc. Silver nanowire (AgNW) stock dispersions (10 mg/mL in ethanol) were purchased from Blue Nano Inc. Indium tin oxide (ITO) was received on glass (15-25 Ω/sq) (Delta Technologies). The remaining materials were used as received: p-styryldiphenylphosphine (DPPS) (Hokko Chemical Industry), Trigonox® 101-45B-PD-AM (2,5-Dimethyl-2,5-di(tert-butylperoxy)hexane) (peroxide) (Akzo Nobel); poly(dimethylsiloxane) Sylgard-184 (PDMS) (Aldrich) Satintone calcined clay (Stochem Inc.), Polyethylene AC-617A (Canada Colours Chemicals Ltd), zinc oxide (Kadox 920) Grade PC 216 (St Lawrence Chemicals), Vulkacit LDA (LANXESS).

Mixing Procedure:

For 12YR053, the polymer was added to a Brabender internal mixer equipped with high shear (roller) blades at 60° C. and 60 rpm. The rubber was masticated alone for 60 seconds followed by addition of DPPS. The peroxide was added after 4 minutes of mixing and mixture dumped after 6 minutes. Once all the ingredients were incorporated, the compound was refined with 6×¾ inch cuts and 6 endwise passes. The formulations are described in Table 1. For 12YR051, the polymer was added to a Brabender internal mixer equipped with Banbury shear blades at 60° C. and 60 rpm. The rubber was masticated alone for 60 seconds followed by addition of fillers. The curative and zinc oxide was incorporated on the mill and the compound was refined with 6×¾ inch cuts and 6 endwise passes.

TABLE 1

Butyl Rubber Formulations for unfilled and white-filled butyl rubber.

| Ingredient (PHR) | 12YR053 | 12YR051 |
|---|---|---|
| BB2030 | 100 | 100 |
| DPPS | 5 | — |
| Satintone calcined clay | — | 80 |
| Polyethylene AC-617A | — | 2 |
| ZnO Kadox920 | — | 3 |
| Vulkacit LDA | — | 0.2 |
| Trigonox ® 101-45B-PD-AM | 0.3 | — |

Figure 3:
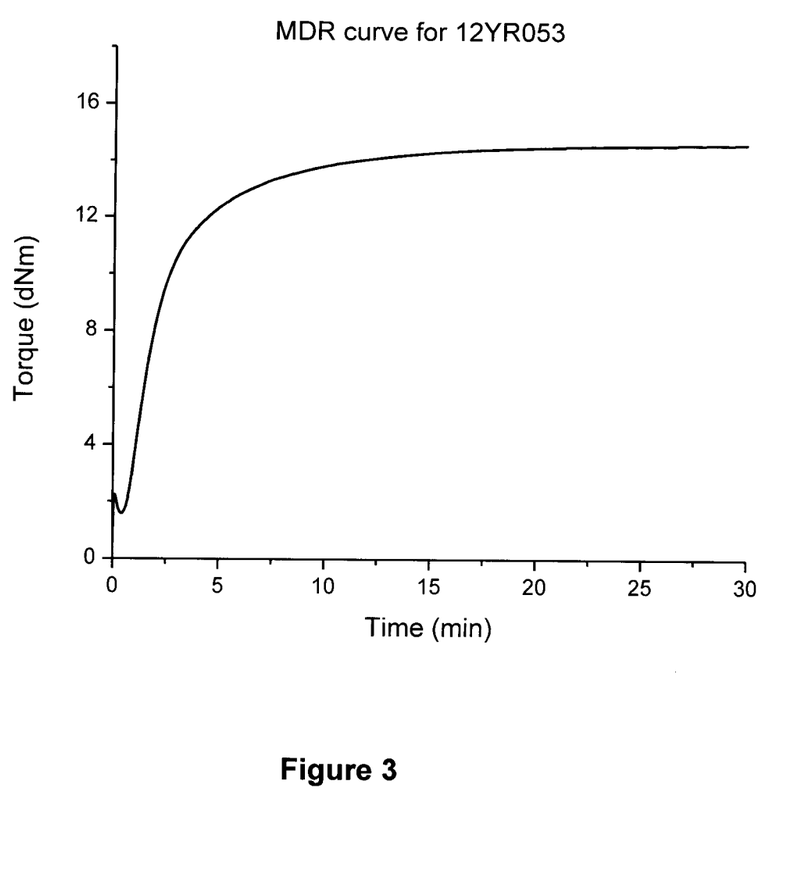
FIG. 3 is a moving die rheometry (MDR) (using frequency oscillation of 1.7 Hz and 1° Arc) plot for 12YR053 at 175° C. for 30 minutes.
Figure 4:
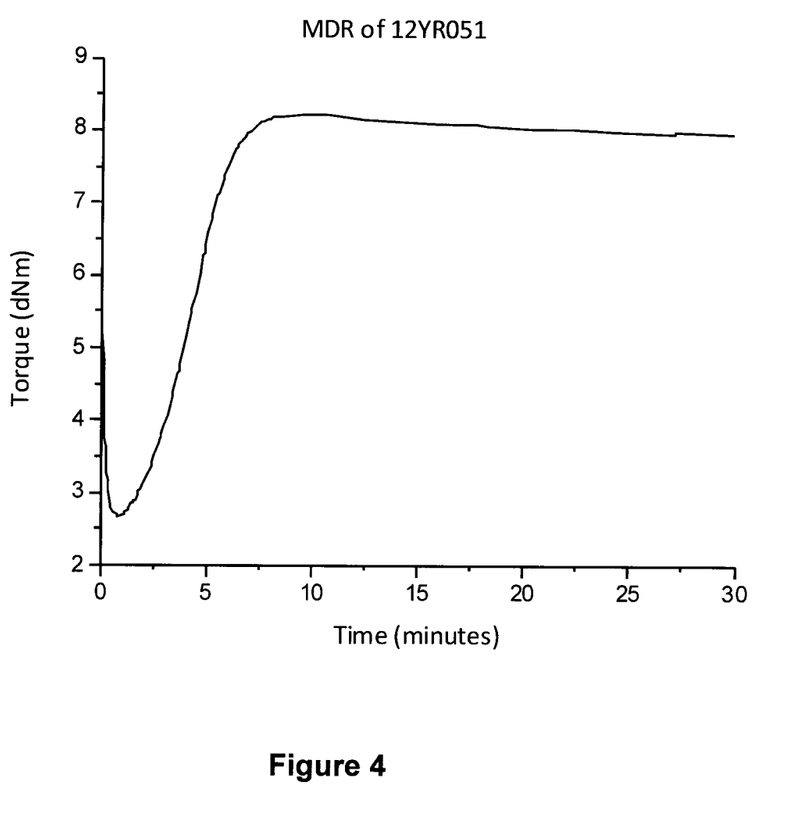
FIG. 4 is an MDR (using frequency oscillation of 1.7 Hz and 1° Arc) plot for 12YR051 at 160° C. for 30 minutes.
Figure 5:
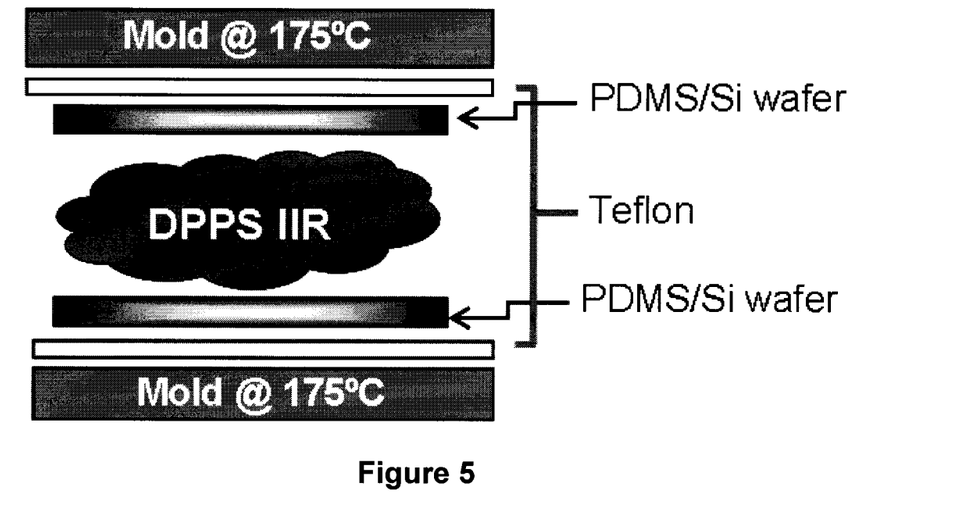
FIG. 5 is a schematic of sample preparation for cure of BB2030-DPPS butyl rubber ionomer sheets against poly (dimethylsiloxane) (PDMS) coated wafer between sheets of Teflon® at 175° C. for 8 minutes.

Experimental:

MDR: The t90 and delta torques were determined according to ASTM D-5289 with the use of a Moving Die Rheometer (MDR 2000E) using a frequency of oscillation of 1.7 Hz and a 1° arc at 175° C. for 30 minutes total run time for 12YR053 (FIG. 3) and at 160° C. for 30 minutes for 12YR051 (FIG. 4). The rheological results are tabulated in Table 2 and physical testing results in Table 3.

TABLE 2

Rheological testing results for unfilled- and white-filled BB2030 using MDR (1 degree arc, 1.7 Hz, 30 min).

| MDR results | 12YR053 | 12YR051 |
|---|---|---|
| MH (dNm) | 14.6 | 8.9 |
| ML (dNm) | 1.6 | 2.8 |
| MH − ML (dNm) | 13.05 | 6.1 |
| ts2 (min) | 1.0 | 1.7 |
| t90 (min) | 7.5 | 3.5 |

TABLE 3

Physical testing results from cure of unfilled- and white-filled BB2030 sheets for t90 + 5 min.

| Physical property | 12YR053 | 12YR051 |
|---|---|---|
| $t_{cure}$ (min) | 8 | 9 |
| Hardness (ShoreA) | 40 | 45 |
| Tensile strength (MPa) | 3.51 | 7.81 |
| Ultimate elongation (%) | 170 | 780 |
| Modulus @ 25% (MPa) | 0.41 | 0.58 |
| Modulus @ 50% (MPa) | 0.64 | 0.76 |
| Modulus @ 100% (MPa) | 1.17 | 0.99 |
| Modulus @ 200% (MPa) | — | 1.43 |
| Tear strength (25° C.) | 7.22 | 17.82 |
| Tear strength (60° C.) | 6.10 | 10.80 |

Curing butyl rubber sheets: Cure times and temperatures varied with each MR formulation. Unfilled transparent IIR (12YR053) was cured for 8 minutes at 175° C. White-filled IIR (12YR051) was cured for 9 minutes at 160° C. MR substrates (~0.5 mm thick), were cut to size and cleaned by sonication in acetone and isopropanol for 10 min each in a Branson sonicator (Model 3510).

Preparation of PDMS Barrier Layers: PDMS (Dow Corning Sylgard 184) was prepared by mixing pre-polymer with curing agent in a 10:1 w/w ratio and stirring, followed by degassing. The pre-polymer mixture was cured against a Petri dish in an oven at 60° C. for at least 1 hour to obtain smooth substrates.

Preparation of AgNW films on Glass. Glass slides (2.5× 2.5 cm) were cleaned by sonication in water and isopropanol for 15 min each in a Branson sonicator (Model 3510), and then treated with air plasma for 1 minute in a Harrick plasma cleaner (Model: PDC-001) at air pressure of 10 psig and a flow rate of 9.2 mL/min at medium discharge setting. A silver nanowire dispersion was diluted in anhydrous ethanol to 0.6 mg/mL and sonicated for 20 seconds to reduce nanowire aggregation. Immediately following sonication, 0.3 mL of the dispersion was drop cast onto the surface of oxidized glass slides. The samples were allowed to dry on a KS 130 basic (IKA) shaker at 160 rpm at room temperature. A 0.5 cm wide border of the AgNW/glass surface was gently swabbed with isopropanol to remove nanowire aggregates around the edge of each sample. The samples were then dried under a stream of nitrogen.

Etching of AgNW Films on Glass with Barrier Layers PDMS (0.85±0.05 mm thick) and IIR (12YR053) (0.4±0.05 mm thick) barrier layers were laminated onto the AgNW films on glass. The barrier layer was allowed to wet the ~0.5 cm wide border of glass surrounding the film, forming a seal around it. The protected AgNW samples were placed in a vapour chamber along with unprotected AgNW reference samples. 10 drops of HNO3 were added to the chamber to form the HNO3 vapour. The samples were exposed to HNO3 vapour for 12 hours and removed from the chamber. The barrier layers were then carefully removed from the samples.

Etching of ITO on Glass with Barrier Layers ITO on glass was cleaned for 5 minutes in a UV-ozone (Jelight, Model 42A). PDMS (0.85±0.05 mm thick) and IIR (12YR051) (0.4±0.05 mm thick) barriers were laminated onto the surface of the ITO and the edges were sealed with epoxy. The protected ITO samples were placed in a vapour chamber along with unprotected ITO reference samples. 10 drops of HCl were added to the chamber to form the HCl vapour. After 10 hours of exposure the sample were removed from the chamber and the barrier layers were removed from the samples.

Characterization of Films Ultraviolet-visible (UV-Vis) transmission spectra were collected for the glass substrate and conductive layer using a Varian Cary 50 UV-Visible Spectrophotometer. Sheet resistance measurements were carried out using a Keithley 2601A System SourceMeter with a four-point wire setup. Small drops (~2 mm in diameter) of gallium-indium eutectic (EGaIn) were placed onto all four corners of the electrodes. The EGaIn served as an electrically conductive layer, protecting the surface of the samples from damage by the probe tips. An average sheet resistance and standard deviation value was determined from 3 contact measurements for a minimum of 3 samples for each barrier layer. Optical inspection was carried out using an Olympus BX51M optical microscope with dark field illumination. Optical micrographs were captured using an Olympus Qcolor 3 digital microscope camera.

Results and Discussion

Experimental Design

Figure 6:
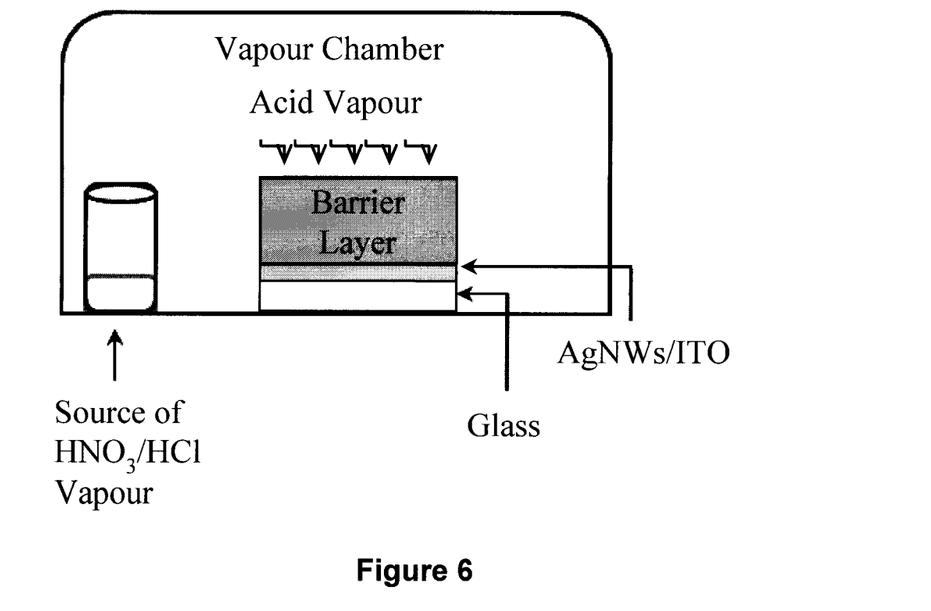
FIG. 6 is a schematic of the experimental setup for nitric acid (HNO3) and hydrochloric acid (HCl) vapour etching of elastomer-protected silver nanowire (AgNW) and indium tin oxide (ITO) conductive layers.

AgNW and ITO films on glass were protected with either an MR or PDMS barrier layer. For ITO on glass, conformal contact between barrier layer and the conductive surface ensured that the corrosive vapours could only contact the ITO by penetrating through the protective layer. For AgNW films on glass, however, the weak AgNW-glass adhesion required that the barrier layer not make direct contact with the AgNW film to prevent film delamination. Instead, an outer border of the AgNW film was removed, exposing the underlying glass, and the barrier layer was carefully placed on top. The barrier layer was allowed to make conformal contact with the glass surrounding the AgNW network but not the AgNW network itself. This precaution prevented the nanowires from peeling off the surface during the removal of the barrier layer and also ensured that the corrosive vapours could only contact the film by penetrating through the protective layer. The samples were placed in a chamber containing a vapour of $HNO_3$ for twelve hours (for AgNWs) or HCL for ten hours (for ITO) (FIG. 6).

Etching of AgNW Films through IIR and PDMS Barrier Layers

Figure 7:
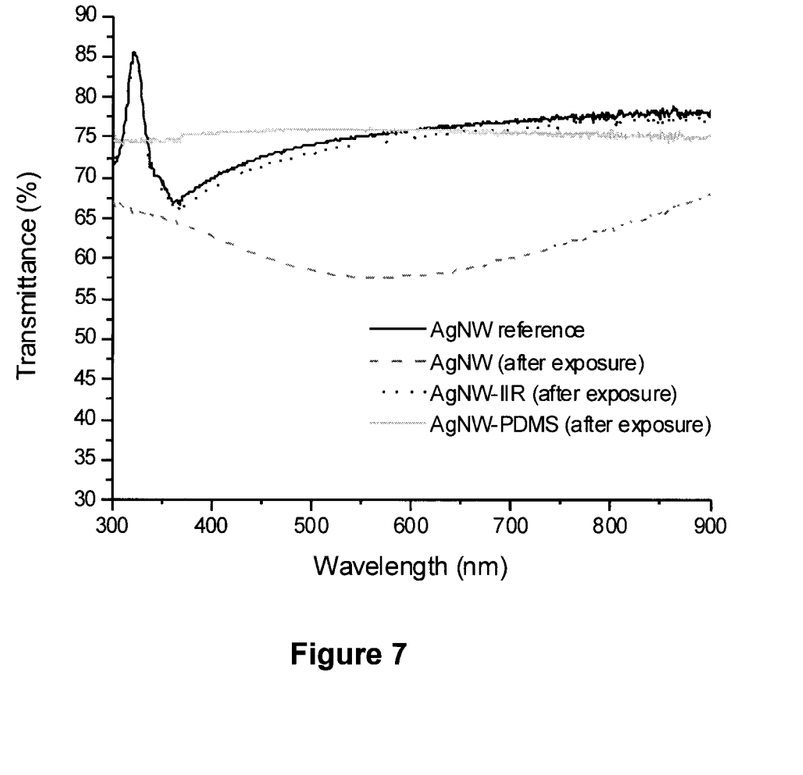
FIG. 7 shows the UV-Vis spectra of AgNW films before exposure to nitric acid vapour (black), and after 12 hours exposure with no protection (dark grey; dash), with an MR protective layer (12YR053) (black; dot) and with a PDMS protective layer (light grey)

FIG. 7 shows the UV-Vis transmittance spectra of AgNW films before and after exposure to nitric acid vapour for twelve hours. Encapsulant was removed prior to spectroscopy. Before exposure to the vapour, the AgNW film exhibits a signature absorbance peak between 360-370 nm. After exposure to the vapour, this peak is no longer detectable, indicating that the film is significantly degraded by the vapour. The transmittance spectrum of the film protected with IIR (12YR053) after nitric acid vapour exposure is nearly identical to that of the original unexposed AgNW film, which indicates that IIR is an effective barrier that resists permeation of the acid vapour. The transmittance spectrum of the PDMS protected film, however, is flat and lacks the signature absorbance peak, suggesting significant acid vapour degradation of the underlying AgNW film through the PDMS barrier.

Nitric acid degradation of AgNWs can also be detected by changes in the sheet resistance of the film (Table 4). The initial sheet resistance of the AgNW films was <15 Ω/sq. Exposure of the unprotected AgNW film to nitric acid vapour degrades the film so that it is no longer conductive. AgNW films protected with MR, however, showed no significant change in sheet resistance after 12 hours of exposure to nitric acid vapour, indicating that the MR barrier layer blocks the nitric acid fumes from degrading the underlying AgNW film. PDMS provided very poor protection from acid vapour permeation: AgNW films were no longer conductive after 12 hours of nitric acid vapour exposure.

TABLE 4

Summary of sheet resistance values obtained for AgNW films on glass after 12 hours exposure to $HNO_3$ vapour.

Figure 8:
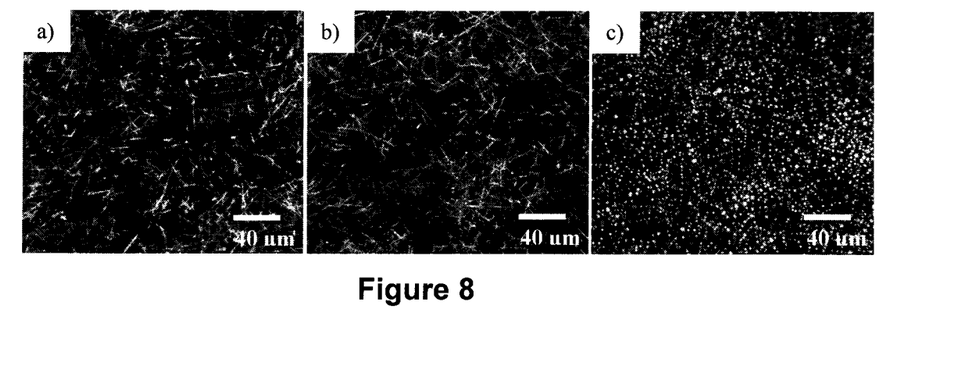
FIG. 8 shows optical microscope images of AgNW films on glass (a) before nitric acid vapour exposure; (b) laminated with an MR barrier (12YR053) and exposed to nitric acid vapour for 12 h; (c) laminated with a PDMS barrier and exposed to nitric acid vapour for 12 h; and, FIG. 9 shows the transmittance of ITO films after 10 hour exposure to HCl vapour with no barrier layer (dark grey), PDMS barrier layer (light grey), and butyl rubber (MR) barrier layer (12YR051) (black; dot) in comparison with an un-etched ITO reference sample (black).

| Sample | Before $HNO_3$ Vapour Ave. Sheet Resistance (Ω/sq) | After 12 hr $HNO_3$ Vapour Ave. Sheet Resistance (Ω/sq) |
|---|---|---|
| Unprotected AgNW Film | 10.8 ± 2.4 | ∞ |
| IIR Protected (12YR053) | 11.2 ± 3.2 | 13.2 ± 1.8 |
| PDMS Protected | 9.9 ± 3.7 | ∞ | microscope images of IIR-protected AgNW films showed no obvious change in film morphology and quality before (FIG. 8a) and after (FIG. 8b) exposure to nitric acid vapour. Therefore, IIR acts as a highly effective barrier that protects the underlying AgNW film from damage. Microscope images of PDMS-protected AgNW films (FIG. 8c) show significant degradation of the nanowire network due to permeation of nitric acid vapour through the PDMS. Individual wires were etched away, leaving spherical islands of silver. These islands do not contact one another, substantially eliminating the possibility of electrical conductivity across the surface.

Figure 9:
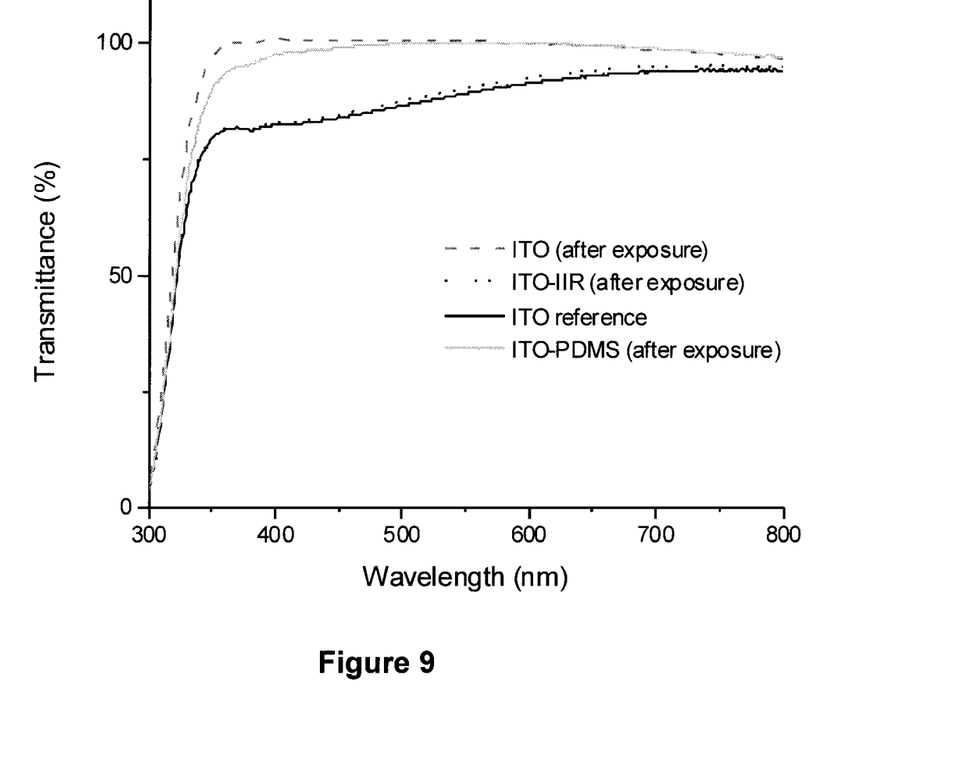

Etching of ITO Films through IIR and PDMS Barrier Layers Films of ITO on glass with laminated PDMS and MR barrier layers were exposed to HCl vapour for ten hours, and then we characterized the underlying ITO films using UV-vis spectroscopy and sheet resistance measurements. Barriers were removed prior to spectroscopy. FIG. 9 shows the UV-vis transmittance spectrum of ITO with and without barrier layers after exposure to HCl vapour etchant for ten hours. Without a barrier layer, the transmittance is close to 100% across the visible spectrum due to removal of the ITO film by the HCl vapour. With an $II_R$ (12YR051) barrier, the transmittance was indistinguishable from a reference sample of an unetched ITO film, indicating that MR resists permeation of HCl vapour and thus effectively protects the underlying ITO film. PDMS was not an effective barrier layer. The transmittance of the PDMS-protected sample was in between that of the reference unetched ITO sample and the fully etched unprotected ITO sample, indicating partial etching of the ITO film due to permeation of HCl vapour through the PDMS barrier.

HCl etching also has a significant effect on the sheet resistance of ITO films. Etching of ITO films in HCl vapour increases the sheet resistance of the film up to the point where the film is no longer conductive. Unprotected ITO exposed to HCl vapour for 10 hours is no longer conductive, suggesting that little to no ITO remains on the surface. The sheet resistance of an ITO film protected by an IIR barrier layer after 10 hours exposure to HCL vapour is 24.7±0.3 Ω/sq, which is indistinguishable from the sheet resistance of an unetched ITO reference sample (24.5±0.2 Ω/sq). In contrast, the sheet resistance of an ITO film protected by a PDMS barrier layer increased dramatically to 100.7 Ω/sq after 10 hours exposure to HCl vapour, a $_{31}$ 1% increase (based on average values) compared to the initial sheet resistance of unetched ITO on glass. Table 5 summarizes the sheet resistance data.

TABLE 5

Summary of sheet resistance values of ITO films after 10 hours exposure to HCl vapour etchant.

| Sample | Before HCl Vapour Ave. Sheet Resistance (Ω/sq) | After 10 hr HCl Vapour Ave. Sheet Resistance (Ω/sq) |
|---|---|---|
| Unprotected ITO Film | 24.5 ± 0.2 | ∞ |
| IIR Protected (12YR051) | 24.5 ± 0.2 | 24.7 ± 0.3 |
| PDMS Protected | 24.5 ± 0.2 | 100.7 ± 11.2 |

AgNW and ITO films protected with MR and exposed to corrosive vapours are optically and electrically indistinguishable from unetched reference films. No significant increase was observed in the sheet resistance of samples protected by MR, and the transmission spectra of IIR-protected films and unetched films were virtually indistinguishable. PDMS barrier layers, however, provided ineffective protection from corrosive vapours to underlying AgNW and ITO films. There was significant permeation of the corrosive vapour through PDMS, allowing etching of both ITO and AgNW films. The sheet resistance of ITO films increased by $_{31}$ 1% relative to unetched ITO reference samples, and etching of individual AgNWs destroyed connections within AgNW films, rendering them nonconductive. Our experiments demonstrate that MR is a highly effective barrier against corrosive vapours compared to PDMS, making it a superior encapsulation material.

Although the invention has been described in detail in the foregoing for purposes of illustration, it is understood that such detail is solely for that purpose and that variations can be made therein by those skilled in the art without departing from the spirit and scope of the invention except as it may be limited by the claims.

What is claimed is:

1. An electrical device comprising:
   a substrate,
   an electrically conductive layer disposed on the substrate and having an electrical resistance to flow of electricity therethrough, and
   an encapsulant layer disposed over at least the conductive layer to inhibit contact of moisture and gas with the electrically conductive layer, wherein the encapsulant layer comprises cured butyl rubber ionomer, the butyl rubber ionomer comprising a reaction product of:
      at least one nitrogen or phosphorous based nucleophile comprising a pendant vinyl group, and
      a halogenated copolymer derived from an olefinic copolymer comprising repeat units derived from at least one isoolefin monomer and repeat units derived from one or more multiolefin monomers in an amount of 0.5 to 2.5 mole percent, based on the total number of monomers in the olefinic copolymer,
   wherein the reaction product includes 0.5 to 4 molar equivalents of the at least one nitrogen or phosphorous based nucleophile;
   wherein the device exhibits an increase in electrical resistance of less than 100% following exposure to nitric acid vapour for 12 hours or hydrochloric acid vapour for 10 hours.

2. The device of claim 1, wherein the device exhibits a change in optical transmittance at 365 nm of less than 15% following exposure to nitric acid vapour for 12 hours or hydrochloric acid vapour for 10 hours.

3. The device of claim 1, wherein the electrically conductive layer comprises at least one of: silver and indium tin oxide.

4. The device of claim 1, wherein the substrate-comprises glass.

5. The device of claim 1, wherein the butyl rubber comprises a filler.

6. The device of claim 1, wherein:
   the isoolefin monomer comprises a $C_4$ to $C_8$ isomonoolefin monomer; and
   the multiolefin monomer comprises a $C_5$ to $C_{11}$ conjugated aliphatic diene monomer.

7. The device of claim 6, wherein:
   the isoolefin monomer comprises isobutylene; and
   the multiolefin monomer comprises isoprene.

8. The device of claim 1, wherein the wherein an amount of ionomeric moiety in the butyl rubber ionomer is at least 0.75 mol %.

9. The device of claim 1, wherein the butyl rubber ionomer further comprises one or more co-polymerizable alkyl-substituted vinyl aromatic co-monomers.

10. The device of claim 9, wherein the co-monomer comprises a $C_1$-$C_4$ alkyl substituted styrene.

11. The device of claim 10, wherein the co-monomer comprises α-methyl styrene, p-methyl styrene, chlorostyrene, cyclopentadiene or methylcyclopentadiene.

12. The device of claim 1, wherein the nitrogen or phosphorous based nucleophile is selected according to the formula, wherein:
   A is nitrogen or phosphorus; and, $R_1$, $R_2$ and $R_3$ are independently selected and comprise: linear or branched $C_1$-$C_{18}$ alkyl substituents; an aryl substituent which is monocyclic or composed of fused $C_4$-$C_8$ rings; or, combinations thereof, wherein at least one of $R_1$, $R_2$ and $R_3$ contains a pendant vinyl group.

13. The device of claim 12, wherein the nucleophile is selected from the group consisting of diphenylphosphinostyrene (DPPS), allyldiphenylphosphine, diallylphenylphosphine, diphenylvinylphosphine, triallylphenylphosphine, N-vinyl caprolactam, N-vinyl phthalimide, 9-vinyl carbazole, N-[3-(dimethylamino)propyl]methacrylamide, diphenylvinylphsophin-methyl-N-vinylacetamide, N-allyl-N-butyl-2-propen-1-amine, 1-vinyl-2-pyrrolidone, 2-Isopropenyl-2-oxazoline, 2-vinylpyrid-4-vinylpyridine, N-ethyl-2-vinylcarbazole and mixtures thereof.

14. The device of claim 13, wherein the nucleophile comprises diphenylphosphinostyrene (DPPS).

15. The device of claim 12, wherein:
   the isoolefin monomer comprises a $C_4$ to $C_8$ isomonoolefin monomer;
   the multiolefin monomer comprises a $C_5$ to $C_{11}$ conjugated aliphatic diene monomer; and
   the nucleophile is selected from the group consisting of diphenylphosphinostyrene (DPPS), allyldiphenylphosphine, diallylphenylphosphine, diphenylvinylphosphine, triallylphenylphosphine, N-vinyl caprolactam, N-vinyl phthalimide, 9-vinyl carbazole, N-[3-(dimethylamino)propyl]methacrylamide, diphenylvinylphsophin-methyl-N-vinylacetamide, N-allyl-N-butyl-2-propen-1-amine, 1-vinyl-2-pyrrolidone, 2-Isopropenyl-2-oxazoline, 2-vinyl pyrid-4-vinylpyridine, N-ethyl-2-vinylcarbazole and mixtures thereof.

16. The device of claim 15, wherein:
the isoolefin monomer comprises isobutylene;
the multiolefin monomer comprises isoprene; and
the nucleophile comprises diphenylphosphinostyrene (DPPS).

17. The device of claim 16, wherein the butyl rubber further comprises one or more co-polymerizable co-monomers selected from the group consisting of: α-methyl styrene, p-methyl styrene, chlorostyrene, cyclopentadiene or methylcyclopentadiene.

18. The device of claim 1, wherein the encapsulant layer is a cured layer laminated onto the substrate and/or the electrically conductive layer, optionally using an adhesive.

19. An electrical device comprising:
a substrate,
an electrically conductive layer disposed on the substrate and having an electrical resistance to flow of electricity therethrough, and
an encapsulant layer disposed over at least the conductive layer to inhibit contact of moisture and gas with the electrically conductive layer, wherein the encapsulant layer comprises cured butyl rubber ionomer, the butyl rubber ionomer comprising a reaction product of:
at least one phosphorous based nucleophile comprising a pendant vinyl group, and
a brominated copolymer derived from an olefinic copolymer consisting of:
  i. repeat units derived from at least one isoolefin monomer including isobutylene;
  ii. repeat units derived from one or more multiolefin monomers in an amount of 0.5 to 2.5 mole percent, based on the total number of monomers in the olefinic copolymer and including isoprene, and
  iii. optionally one or more co-polymerizable alkyl-substituted vinyl aromatic co-monomers selected from the group consisting of α-methyl styrene, p-methyl styrene, chlorostyrene, cyclopentadiene and methylcyclopentadiene;
wherein the reaction product includes 0.5 to 4 molar equivalents of the at least one phosphorous based nucleophile;
wherein the device exhibits an increase in electrical resistance of less than 100% following exposure to nitric acid vapour for 12 hours or hydrochloric acid vapour for 10 hours; and the device exhibits a change in optical transmittance at 365 nm of less than 15% following exposure to nitric acid vapour for 12 hours or hydrochloric acid vapour for 10 hours.

20. The device of claim 19, wherein the wherein an amount of ionomeric moiety in the butyl rubber ionomer is at least 0.75 mol % and the nucleophile comprises diphenylphosphinostyrene (DPPS).

* * * * *